United States Patent
Hoang (12)

(10) Patent No.: US 10,847,236 B2
(45) Date of Patent: *Nov. 24, 2020

(54) MEMORY CELL WITH A SENSING CONTROL CIRCUIT

(71) Applicant: eMemory Technology Inc., Hsin-Chu (TW)

(72) Inventor: Dung Le Tan Hoang, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/554,646

(22) Filed: Aug. 29, 2019

(65) Prior Publication Data

US 2020/0126629 A1 Apr. 23, 2020

Related U.S. Application Data

(60) Provisional application No. 62/746,557, filed on Oct. 17, 2018.

(51) Int. Cl.
| | | |
|---|---|---|
| *G11C 17/18* | (2006.01) | |
| *G11C 8/08* | (2006.01) | |
| *G11C 7/12* | (2006.01) | |
| *G11C 17/16* | (2006.01) | |
| *G11C 29/00* | (2006.01) | |
| *G11C 29/02* | (2006.01) | |

(52) U.S. Cl.
CPC .............. *G11C 17/18* (2013.01); *G11C 7/12* (2013.01); *G11C 8/08* (2013.01); *G11C 17/16* (2013.01); *G11C 29/027* (2013.01); *G11C 29/785* (2013.01)

(58) Field of Classification Search
CPC .. G11C 17/18; G11C 8/08; G11C 7/12; G11C 17/16; G11C 29/785; G11C 29/027
USPC ...................................................... 365/225.7
See application file for complete search history.

(56) References Cited

U.S. PATENT DOCUMENTS

| | | | |
|---|---|---|---|
| 5,870,327 A | 2/1999 | Gitlin | |
| 7,253,496 B2 | 8/2007 | Jenne | |
| 7,920,401 B2 * | 4/2011 | Xu | ......................... G11C 17/16 365/96 |

(Continued)

FOREIGN PATENT DOCUMENTS

| | | |
|---|---|---|
| TW | 201709210 A | 3/2017 |
| TW | I640995 B | 11/2018 |

*Primary Examiner* — Fernando Hidalgo
(74) *Attorney, Agent, or Firm* — Winston Hsu

(57) ABSTRACT

A memory cell includes a first anti-fuse element, a first select transistor, a second anti-fuse element, a second select transistor, and a sensing control circuit. The first anti-fuse element is coupled to an anti-fuse control line, and the first select transistor transmits a voltage between a first bit line and the first anti-fuse element according to a voltage on the word line. The second anti-fuse element is coupled to the anti-fuse control line. The second select transistor transmits a voltage between a second bit line and the second anti-fuse element according to the voltage on the word line. The sensing control circuit provides a discharging path to a system voltage terminal from the first select transistor or the second select transistor according to states of the first anti-fuse element and the second anti-fuse element during a read operation.

25 Claims, 7 Drawing Sheets

(56) References Cited

U.S. PATENT DOCUMENTS

| | | | |
|---|---|---|---|
| 8,830,779 B1* | 9/2014 | Terzioglu | G11C 7/14 365/225.7 |
| 9,601,499 B2 | 3/2017 | Wu | |
| 2018/0315477 A1 | 11/2018 | Lin | |
| 2020/0105356 A1* | 4/2020 | Kulkarni | G11C 17/18 |

* cited by examiner

MEMORY CELL WITH A SENSING CONTROL CIRCUIT

CROSS REFERENCE TO RELATED APPLICATIONS

This non-provisional application claims priority of U.S. provisional application No. 62/746,557, filed on Oct. 17, 2018, included herein by reference in its entirety.

BACKGROUND OF THE INVENTION

1. Field of the Invention

The present invention is related to a memory cell, and more particularly, to a memory cell with a sensing control circuit.

2. Description of the Prior Art

In a memory system, to identify the value of the data stored in a memory cell, a sensing amplifier is often used to compare the data voltage generated by the memory cell with a reference voltage. For example, if the data voltage is higher than the reference voltage, the sensing amplifier will output a high voltage level indicating the value of the data stored in the memory cell to be "0". Otherwise, if the data voltage is lower than the reference voltage, the sensing amplifier will output a low voltage level indicating the value of the data stored in the memory cell to be "1". The voltage level outputted by the sensing amplifier will be stored by a latch for later access.

However, transistors of different sensing amplifiers may have different threshold voltages due to characteristic variation caused during the manufacturing process; therefore, it is difficult to choose a proper reference voltage for identifying the data. The ideal reference voltage for one memory cell can be inappropriate for another memory cell, which may increase the data access time and/or cause a false reading result.

SUMMARY OF THE INVENTION

One embodiment of the present invention discloses a memory cell. The memory cell includes a first anti-fuse element, a first select transistor, a second anti-fuse element, a second select transistor, and a sensing control circuit.

The first anti-fuse element has a first terminal coupled to an anti-fuse control line, and a second terminal. The first select transistor has a first terminal, a second terminal coupled to a first bit line, and a control terminal coupled to a word line. The first select transistor transmits a voltage between the first bit line and the second terminal of the first anti-fuse element according to a voltage on the word line.

The second anti-fuse element has a first terminal coupled to the anti-fuse control line, and a second terminal. The second select transistor has a first terminal, a second terminal coupled to a second bit line, and a control terminal coupled to the word line. The second select transistor transmits a voltage between the second bit line and the second terminal of the second anti-fuse element according to the voltage on the word line.

The sensing control circuit is coupled to the first terminal of the first select transistor and the first terminal of the second select transistor. The sensing control circuit provides a discharging path to a first system voltage terminal from the first terminal of the first select transistor or from the first terminal of the second select transistor according to states of the first anti-fuse element and the second anti-fuse element during a read operation of the first memory cell.

Another embodiment of the present invention discloses a memory system, and the memory system includes a plurality of memory cells. A memory cell of the plurality of memory cells includes a first anti-fuse element, a first select transistor, a second anti-fuse element, a second select transistor, and a sensing control circuit.

The first anti-fuse element has a first terminal coupled to an anti-fuse control line, and a second terminal. The first select transistor has a first terminal, a second terminal coupled to a first bit line, and a control terminal coupled to a word line. The first select transistor transmits a voltage between the first bit line and the second terminal of the first anti-fuse element according to a voltage on the word line.

The second anti-fuse element has a first terminal coupled to the anti-fuse control line, and a second terminal. The second select transistor has a first terminal, a second terminal coupled to a second bit line, and a control terminal coupled to the word line. The second select transistor transmits a voltage between the second bit line and the second terminal of the second anti-fuse element according to the voltage on the word line.

The sensing control circuit is coupled to the first terminal of the first select transistor and the first terminal of the second select transistor. The sensing control circuit provides a discharging path to a first system voltage terminal from the first terminal of the first select transistor or from the first terminal of the second select transistor according to states of the first anti-fuse element and the second anti-fuse element during a read operation of the first memory cell.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
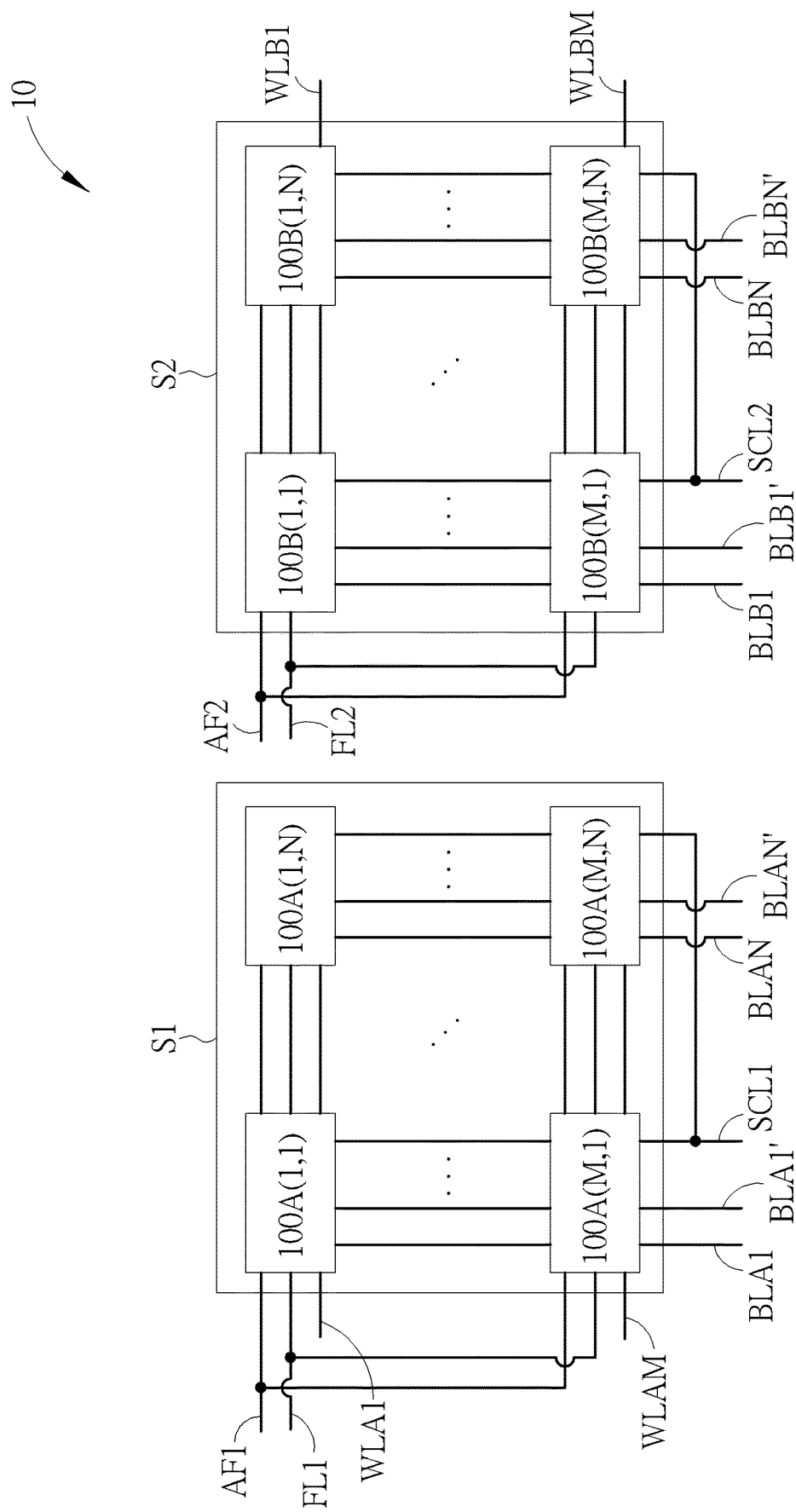
FIG. 1 shows a memory system according to one embodiment of the present invention.

FIG. 1 shows a memory system 10 according to one embodiment of the present invention. The memory system 10 includes a plurality of memory cells 100A(1,1) to 100A(M,N) and 100B(1,1) to 100B(M,N), M and N are positive integers greater than 1. The memory cells 100A(1,1) to 100A(M,N) and 100B(1,1) to 100B(M,N) can have the same structure. Also, in some embodiments, the memory cells 100A(1,1) to 100A(M,N) are disposed in a sector S1, and the memory cells 100B(1,1) to 100B(M,N) are disposed in a sector S2.

In FIG. 1, memory cells in the same sector are coupled to the same anti-fuse control line, the same following gate control line, and the same sensing control line. For example, the memory cells 100A(1,1) to 100A(M,N) in the sector S1 are coupled to the anti-fuse control line AF1, the following gate control line FL1, and the sensing control line SCL1. Also, the memory cells 100B(1,1) to 100B(M,N) in the sector S2 are coupled to the anti-fuse control line AF2, the following gate control line FL2, and the sensing control line SCL2.

Furthermore, in the sector S1, memory cells disposed in the same row are coupled to the same word line, and memory cells disposed in the same column are coupled to the same bit lines. For example, memory cells 100A(1,1) to 100A(1,N) are coupled to the word line WLA1, while memory cells 100A(M,1) to 100A(M,N) are coupled to the word line WLAM. Also, memory cells 100A(1,1) to 100A(M,1) are coupled to the bit lines BLA1 and BLA1', while memory cells 100A(1,N) to 100A(M,N) are coupled to the bit lines BLAN and BLAN'.

Similarly, in the sector S2, memory cells 100B(1,1) to 100B(1,N) are coupled to the word line WLB1, while memory cells 100B(M,1) to 100B(M,N) are coupled to the word line WLBM. Also, memory cells 100B(1,1) to 100B(M,1) are coupled to the bit lines BLB1 and BLB1', while memory cells 100B(1,N) to 100B(M,N) are coupled to the bit lines BLBN and BLBN'.

Figure 2:
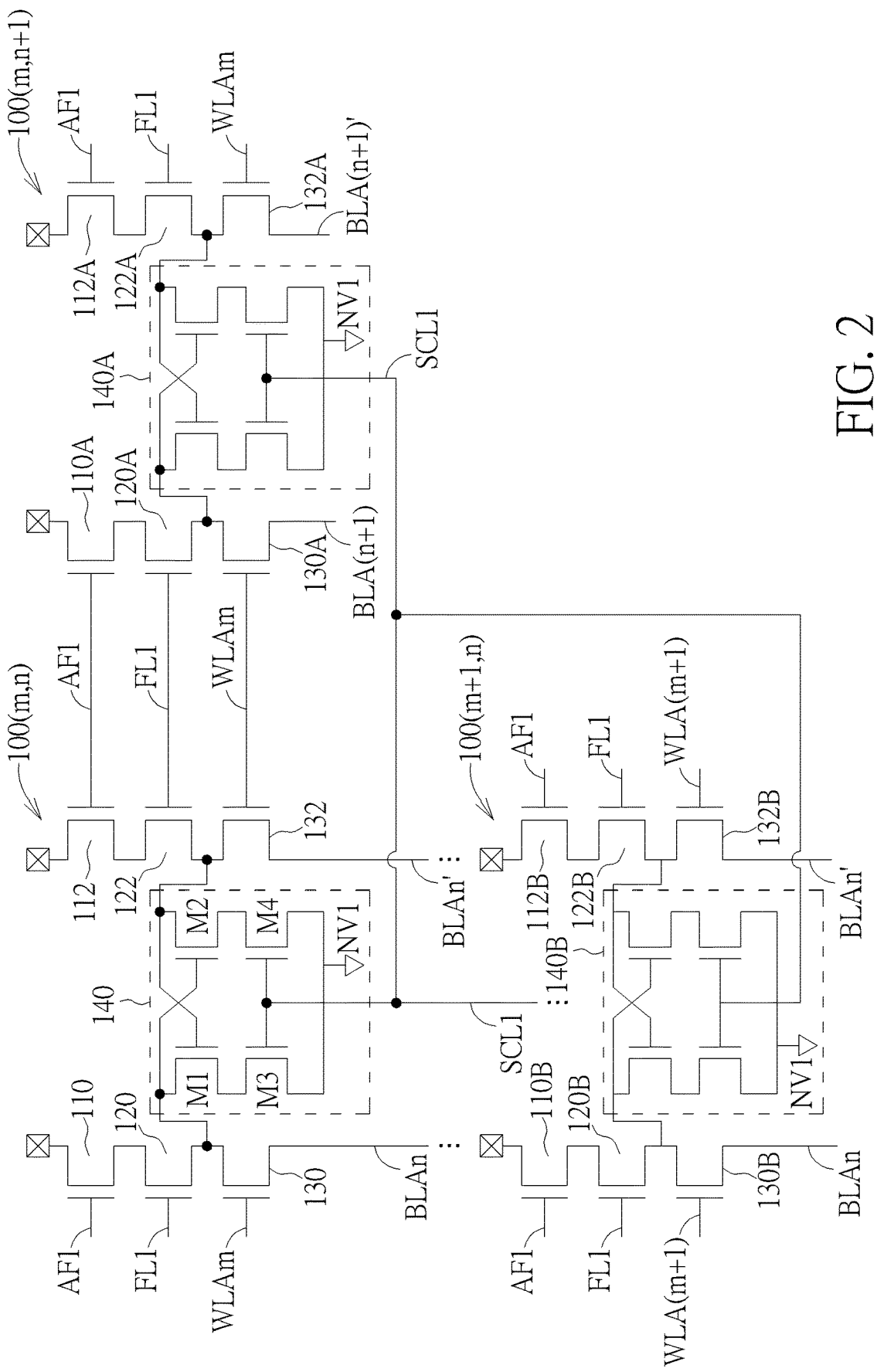
FIG. 2 shows the memory cells of the memory system in FIG. 1 according to one embodiment of the present invention.

FIG. 2 shows the memory cells 100A(m,n), 100A(m,n+1), 100A(m+1,n) in the sector S1 according to one embodiment of the present invention, where m is a positive integer smaller than M, and n is a positive integer smaller than N.

In FIG. 2, the memory cell 100A(m,n) includes anti-fuse elements 110 and 112, following gate transistors 120 and 122, select transistors 130 and 132, and a sensing control circuit 140.

The anti-fuse element 110 has a first terminal coupled to the anti-fuse control line AF1, and a second terminal. The following gate transistor 120 has a first terminal coupled to the second terminal of the anti-fuse element 110, a second terminal, and a control terminal coupled to the following gate control line FL1. The select transistor 130 has a first terminal coupled to the second terminal of the following gate transistor 120, a second terminal coupled to the bit line BLAn, and a control terminal coupled to the word line WLAm.

In some embodiments, the anti-fuse element 110 can be a varactor, and can be ruptured by high voltages. The state of the anti-fuse element 110, that is, being ruptured or not, can be used to represent the value of the stored data of the memory cell 100A(m,n). The following gate transistor 120 can be used to relieve the high voltage stress caused during the program operation. The select transistor 130 can transmit the voltage between the bit line BLAn and the second terminal of the anti-fuse element 110 according to a voltage on the word line WLAm.

Similarly, the anti-fuse element 112 has a first terminal coupled to the anti-fuse control line AF1, and a second terminal. The following gate transistor 122 has a first terminal coupled to the second terminal of the anti-fuse element 112, a second terminal, and a control terminal coupled to the following gate control line FL1. The select transistor 132 has a first terminal coupled to the second terminal of the following gate transistor 122, a second terminal coupled to the bit line BLAn', and a control terminal coupled to the word line WLAm. The select transistor 132 can transmit the voltage between the bit line BLAn' and the second terminal of the anti-fuse element 112 according to a voltage on the word line WLAm.

The sensing control circuit 140 is coupled to the first terminals of the select transistors 130 and 132. The sensing control circuit 140 can provide a discharging path to a system voltage terminal NV1 from the first terminal of the select transistor 130 or from the first terminal of the select transistor 132 according to the states of the anti-fuse elements 110 and 112 during a read operation of the memory cell 100A(m,n). In some embodiments, the system voltage terminal NV1 can provide the system voltage V1, and the system voltage V1 can be the reference voltage of the system.

In FIG. 2, the sensing control circuit 140 includes transistors M1 to M4. The transistor M1 has a first terminal coupled to the first terminal of the select transistor 130, a second terminal, and a control terminal coupled to the first terminal of the select transistor 132. The transistor M2 has a first terminal coupled to the first terminal of the select transistor 132, a second terminal, and a control terminal coupled to the first terminal of the transistor M1.

The transistor M3 has a first terminal coupled to the second terminal of the transistor M1, a second terminal for receiving the system voltage V1, and a control terminal coupled to the sensing control line SCL1. The transistor M4 has a first terminal coupled to the second terminal of the transistor M2, a second terminal for receiving the system voltage V1, and a control terminal coupled to the sensing control line SCL1.

In some embodiments, the anti-fuse elements 110 and 112 can be programmed with complementary data during the program operation of the memory cell 100A(m,n). In this case, the currents generated by the anti-fuse elements 110 and 112 during the read operation will be different. Therefore, the sensing control circuit 140 can amplify the difference and provide the discharging path accordingly. That is, the memory cell 100A(m,n) can sense the current differences locally for the read operation so the reference voltage or the reference current required for the read operation in prior art is no longer required. Consequently, the accuracy of the read operation can be improved, and the access time can be reduced.

Furthermore, the memory cell 100(*m,n*+1) includes anti-fuse elements 110A and 112A, following gate transistors 120A and 122A, and select transistors 130A and 132A.

The anti-fuse element 110A has a first terminal coupled to the anti-fuse control line AF1, and a second terminal. The select transistor 130A has a first terminal, a second terminal coupled to a bit line BLA(n+1), and a control terminal coupled to the word line WLAm. The following gate transistor 120A has a first terminal coupled to the second terminal of the anti-fuse element 110A, a second terminal coupled to the first terminal of the select transistor 130A, and a control terminal coupled to the following gate control line FL1.

The anti-fuse element 112A has a first terminal coupled to the anti-fuse control line AF1, and a second terminal. The select transistor 132A has a first terminal, a second terminal coupled to a bit line BLA(n+1)', and a control terminal coupled to the word line WLAm. The following gate transistor 122A has a first terminal coupled to the second terminal of the anti-fuse element 112A, a second terminal coupled to the first terminal of the select transistor 132A, and a control terminal coupled to the following gate control line FL1. The sensing control circuit 140A is coupled to the first terminals of the select transistors 130A and 132A.

Also, the memory cell 100(m+1,n) includes anti-fuse elements 110B and 112B, following gate transistors 120B and 122B, and select transistors 130B and 132B.

The anti-fuse element 110B has a first terminal coupled to the anti-fuse control line AF1, and a second terminal. The select transistor 130B has a first terminal, a second terminal coupled to the bit line BLAn, and a control terminal coupled to the word line WLA(m+1). The following gate transistor 120B has a first terminal coupled to the second terminal of the anti-fuse element 110B, a second terminal coupled to the first terminal of the select transistor 130B, and a control terminal coupled to the following gate control line FL1.

The anti-fuse element 112B has a first terminal coupled to the anti-fuse control line AF1, and a second terminal. The select transistor 132B has a first terminal, a second terminal coupled to a bit line BLAn', and a control terminal coupled to the word line WLA(m+1). The following gate transistor 122B has a first terminal coupled to the second terminal of the anti-fuse element 112B, a second terminal coupled to the first terminal of the select transistor 132B, and a control terminal coupled to the following gate control line FL1. The sensing control circuit 140B is coupled to the first terminals of the select transistors 130B and 132B.

Figure 3:
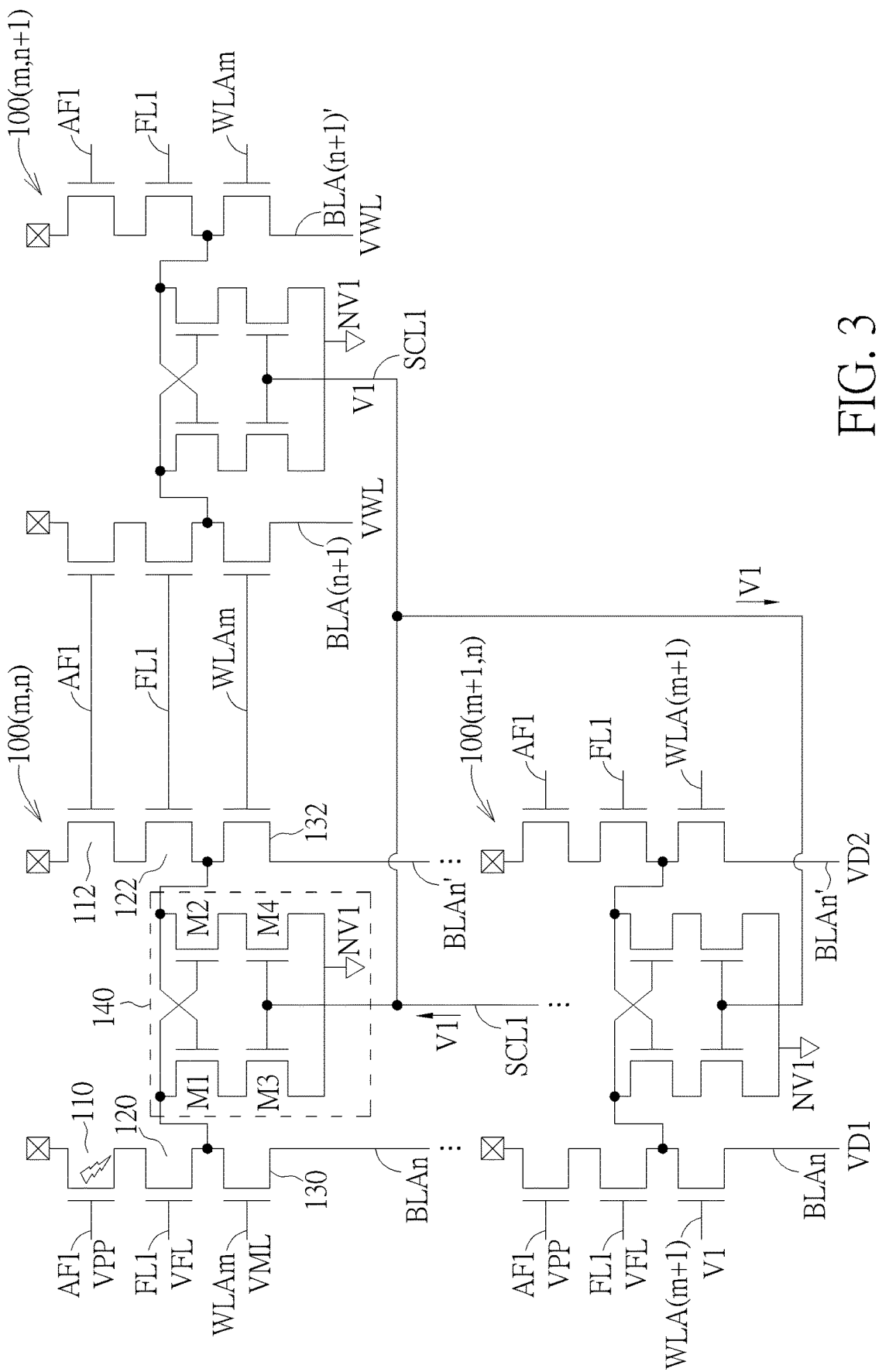
FIG. 3 shows the voltages of the control lines coupled to the memory cells in FIG. 1 during the program operation.

FIG. 3 shows the voltages of the control lines coupled to the memory cells 100A(m,n), 100A(m,n+1), 100A(m+1,n) during the program operation of the memory cell 100A(m,n).

In FIG. 3, the anti-fuse control line AF1 is at a program voltage VPP, the word line WLAm is at a first operation voltage VWL, the following gate control line FL1 is at a second operation voltage VFL, the bit line BLAn is at a first data voltage VD1, and the bit line BLAn' is at a second data voltage VD2.

In some embodiments, the program voltage VPP can be greater than the second operation voltage VFL, the second operation voltage VFL can be greater than the first operation voltage VWL, and the first operation voltage VWL can be greater than the system voltage V1. For example, but not limited to, the program voltage VPP can be 5 to 6V, the second operation voltage VFL can be 2V, the first operation voltage VWL can be 1.6V, and the system voltage V1 can be 0V.

In this case, the first terminals of the anti-fuse elements 110 and 112 will receive the program voltage VPP. Also, the following gate transistors 120 and 122 can be turned on. To program complementary data to the anti-fuse elements 110 and 112, one of the data voltages VD1 and VD2 can be equal to the first operation voltage VWL while the other one of the data voltages VD1 and VD2 can be equal to the system voltage V1. For example, in FIG. 3, the data voltage VD1 can be equal to the system voltage V1, and the data voltage VD2 can be equal to the first operation voltage VWL.

In this case, the select transistor 130 will be turned on, and the second terminal of the anti-fuse element 110 will receive the data voltage VD1. Therefore, the large cross voltage between the data voltage VD1 and the program voltage VPP applied on the anti-fuse element 110 will rupture the anti-fuse element 110.

However, since the data voltage VD2 on the bit line BLAn' is equal to the first operation voltage VWL, the select transistor 132 may not be turned on, and the second terminal of the select transistor 132 can be floating. Therefore, the cross voltage between the first terminal and the second terminal of the anti-fuse element 112 will not high enough to rupture the anti-fuse element 112.

As a result, in FIG. 3, the anti-fuse element 110 is ruptured while the anti-fuse element 112 is not ruptured. In some embodiments, the state of the anti-fuse element 110 being ruptured can represent the data value "1", and the state of the anti-fuse element 112 not being ruptured can represent the data value "0". However, in some other embodiments, the data values can be represented by the opposite states according to the system requirement.

In some embodiments, during the program operation of the memory cell 100A(m,n), the memory cell 100A(m+1,n) should be inhibited from being programmed. In FIG. 3, the word line WLA(m+1) is at the system voltage V1 so the select transistors 130 and 132 of the memory cell 100A(m+1,n) can be turned off. Therefore, the second terminals of the following gate transistors 120 and 122 would be floating (that is, neither V1 nor V2 is received), and the anti-fuse elements 110 and 112 will not be programmed.

Furthermore, in some embodiments, the memory system 10 can be programed by word. That is, memory cells coupled to the same word line can be programmed at the same time. However, in some embodiments, the memory cells can be programmed one by one. That is, during the program operation of the memory cell 100A(m,n), the memory cell 100A(m,n+1) can be inhibited from being programmed. For example in FIG. 3, the bit lines BLA(n+1) and BLA(n+1)' coupled to the memory cell 100A(m,n+1) can both be at the first operation voltage VWL. Consequently, the select transistors 130 and 132 in the memory cell 100A(m,n+1) may not be turned on, and the second terminals of the select transistors 130 and 132 may be floating (neither V1 nor V2 is received). Therefore, the anti-fuse elements 110 and 112 will not be ruptured, thereby inhibiting the memory cell 100A(m,n+1) from being programmed.

In addition, since the sensing control circuit 140 is used for the sensing operation before the read operation, the sensing control line SCL1 can be at the system voltage V1 during the program operation as shown in FIG. 3. Therefore, the transistors M3 and M4 can be turned off, and the sensing control circuit 140 will not affect the program operation.

Figure 4:
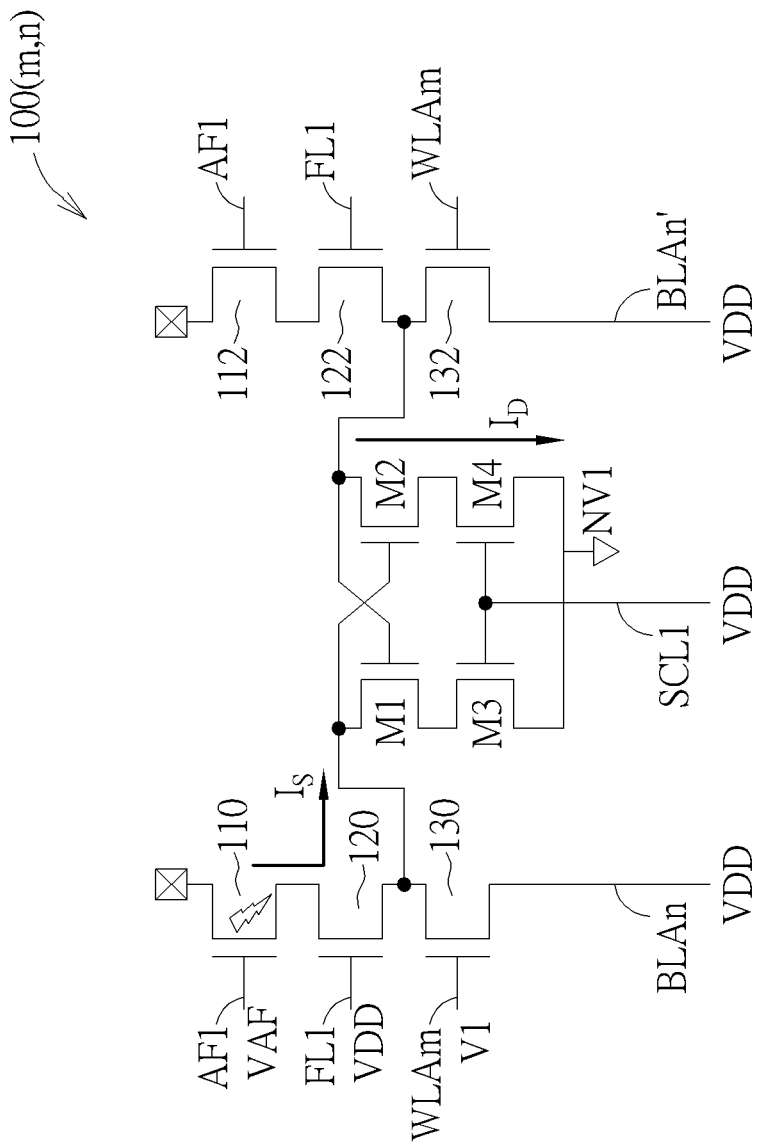
FIG. 4 shows the voltages of the control lines coupled to the memory cell during the sensing operation.

FIG. 4 shows the voltages of the control lines coupled to the memory cell 100A(m,n) during the sensing operation of the memory cell 100A(m,n). In some embodiments, the sensing operation can be performed before the read operation.

In FIG. 4, during the sensing operation, the anti-fuse control line AF1 is at the anti-fuse bias voltage VAF, the word line WLAm is at the system voltage V1, the following gate control line FL1 is at the third operation voltage VDD, and the sensing control line SCL1 is at the third operation voltage VDD. In addition, the bit lines BLAn and BLAn' can be pre-charged to the third operation voltage VDD. In some embodiments, the anti-fuse bias voltage VAF can be greater than the third operation voltage VDD, and the third operation voltage VDD can be greater than the system voltage V1. For example, but not limited to, the anti-fuse bias voltage VAF can be 1.5V to 2V, the third operation voltage VDD can be 1.2V.

In this case, the following gate transistors 120 and 122 can be turned on. Also, since the anti-fuse element 110 is ruptured during the program operation as shown in FIG. 3, the anti-fuse bias voltage VAF can cause the anti-fuse element 110 to generate a current $I_S$ flowing to the first terminal of the transistor M1 if the first terminal of the transistor M1 is at a rather low voltage. The current $I_S$ can keep raising the voltage of the first terminal of the transistor M1 until the voltage of the first terminal of the transistor M1 is raised to a voltage smaller than the third operation VDD by a threshold voltage of the following gate transistor 120.

The high voltage at the first terminal of the transistor M1 will turn on the transistor M2. Since the sensing control line SCL1 is at the third operation voltage VDD, the transistor M4 can be turned on. Therefore, the transistors M2 and M4 can form a discharging path from the first terminal of the select transistor 132 to the system voltage terminal NV1. Consequently, the first terminal of the select transistor 132 will be pulled down to the system voltage V1 by the discharge current $I_D$.

However, since the anti-fuse element 112 is not ruptured during the previous program operation, the anti-fuse element 112 may not generate any currents or may only generate an insignificant current. Therefore, the anti-fuse element 112 will not affect the voltage at the first terminal of the select transistor 132. Therefore, the transistor M1 will remain turned off, and the voltage at the first terminal of the select transistor 130 should be greater than the voltage at the first terminal of the select transistor 132 by end of the sensing operation.

Figure 5:
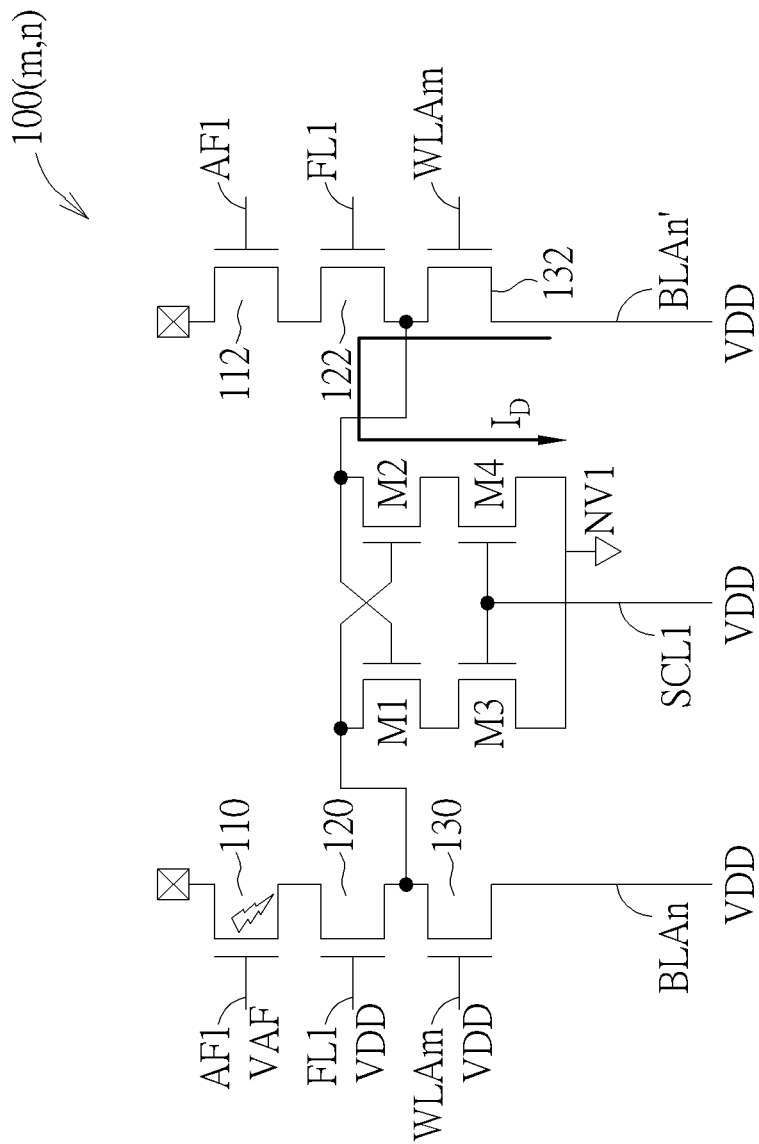
FIG. 5 shows the voltages of the control lines coupled to the memory cell during the read operation.

FIG. 5 shows the voltages of the control lines coupled to the memory cell 100A(m,n) during the read operation of the memory cell 100A(m,n) after the sensing operation.

In FIG. 5, during the read operation, the anti-fuse control line AF1 is at the anti-fuse bias voltage VAF, the word line WLAm is at the third operation voltage VDD, the following gate control line FL1 is at the third operation voltage VDD, and the sensing control line SCL1 is at the third operation voltage VDD. In addition, the bit lines BLAn and BLAn' are precharged to the third operation voltage VDD.

In this case, since the voltage at the first terminal of the select transistor 130 has been raised to a rather high voltage during the sensing operation, the transistor M2 will remain turned on during the read operation. Therefore, the voltage at the bit line BLAn' will be pulled down to the system voltage V1 by the discharging current $I_D$ flowing through the transistors M2 and M4. However, the transistor M1 will remain turned off, the select transistor 130 may still be turned off, and the bit line BLAn may remain at the third operation voltage VDD.

Consequently, the bit lines BLAn and BLAn' will be at different voltages during the read operation, and the voltage difference between the bit lines BLAn and BLAn' will be sensed to identify the data stored by the memory cell 100A(m,n).

Since the data stored by the memory cell 100A(m,n) can be sensed by comparing the currents locally, no reference voltages or reference currents will be needed. Therefore, the impact caused by the characteristic variation of the transistors can be reduced. Consequently, the accuracy of the read operation can be improved, and the access time can be reduced.

In some embodiments, since the memory cell 100A(m,n) can be operated with rather low voltages, the anti-fuse elements 110 and 112, following gate transistors 120 and 122, select transistors 130 and 132 can be manufactured by the same low voltage process.

Figure 6:
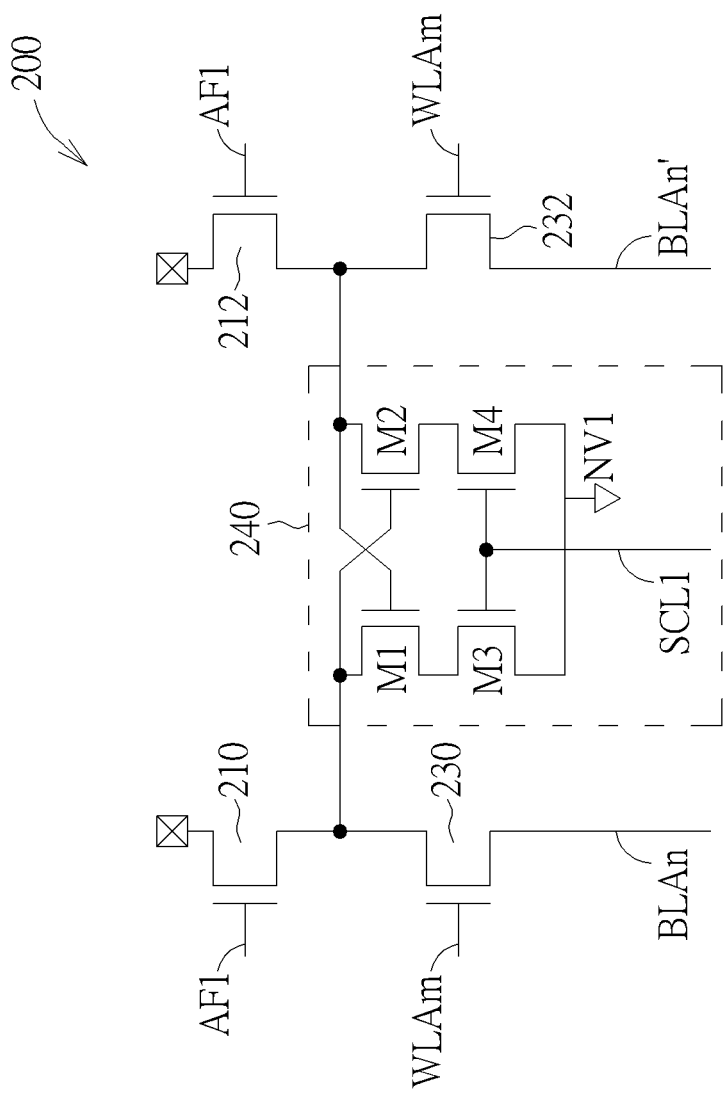
FIG. 6 shows a memory cell according to another embodiment of the present invention.

Also, in some embodiments, the following gate transistors 120 and 122 can be omitted if the program voltages are endurable for the select transistors 130, 132 and the anti-fuse elements 110, 112. FIG. 6 shows a memory cell 200 according to one embodiment of the present invention. The memory cells 100 and 200 have similar structures and can be operated with similar principles. However, the memory cell 200 can omit the following gate transistors and include the anti-fuse elements 210 and 212, the select transistor 230 and 232, and the sense control circuit 240.

In this case, the first terminal of the select transistor 230 can be coupled to the second terminal of the anti-fuse element 210, and the first terminal of the select transistor 232 can be coupled to the second terminal of the anti-fuse element 212. However, the program operation, the sensing operation, and the read operation shown in FIGS. 3, 4 and 5 can still applied by simply omitting the following gate transistors 120 and 122 and the following gate control line FL1.

Figure 7:
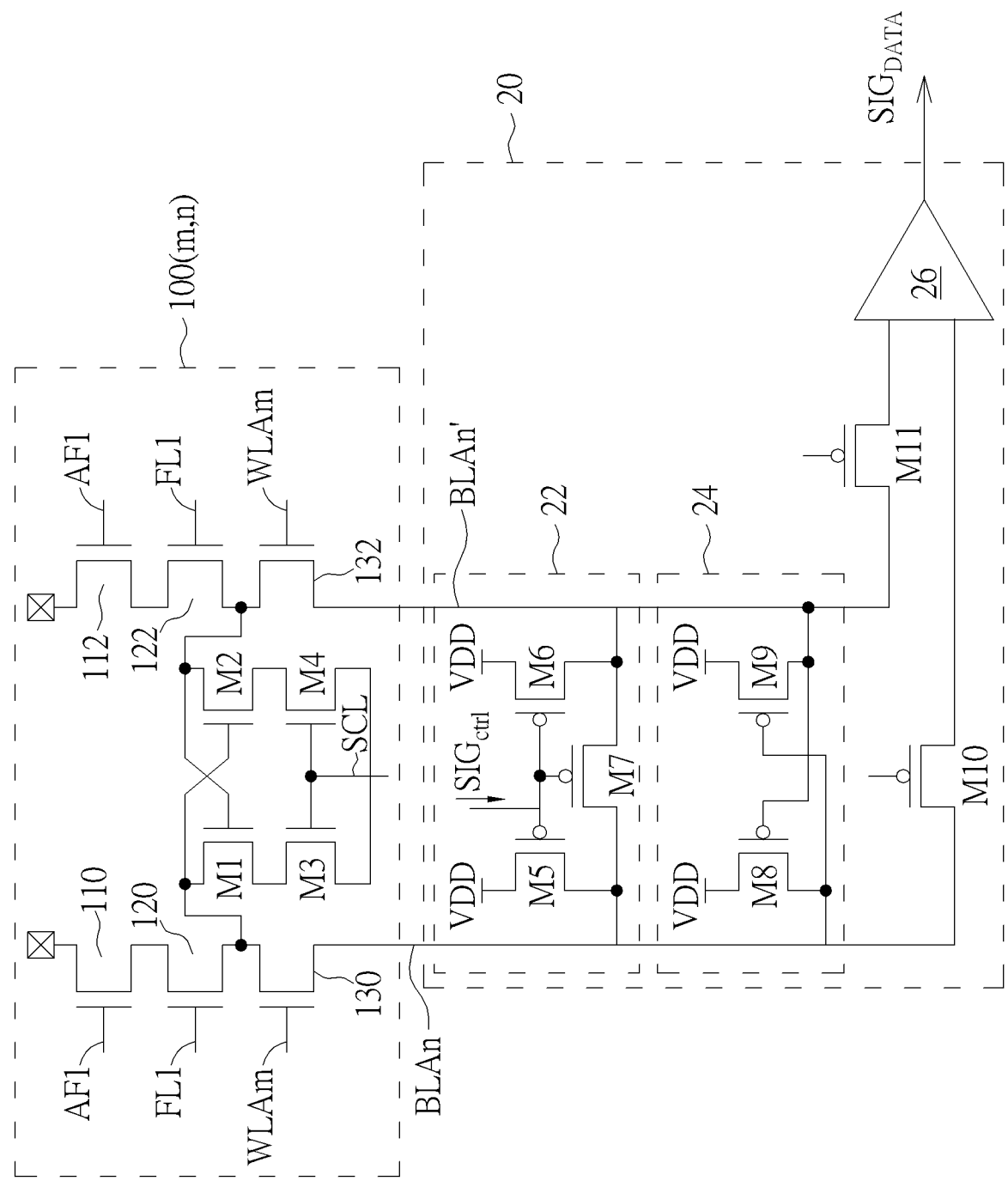
FIG. 7 shows a read control circuit according to one embodiment of the present invention.

FIG. 7 shows a read control circuit 20 according to one embodiment of the present invention. The read control circuit 20 can be used in the memory system 10 to sense the voltage difference between the bit lines for identifying the data stored in the memory cell.

The read control circuit 20 includes a pre-charge control circuit 22, a sensing assistant circuit 24, and a differential sensing amplifier 26.

In FIG. 7, the pre-charge control circuit 22 can be coupled to the bit lines BLAn and BLAn'. The pre-charge control circuit 22 can pre-charge the bit lines BLAn and BLAn' to the third operation voltage VDD during the sensing operation.

The sensing assistant circuit 24 can be coupled to the bit lines BLAn and BLAn'. During the read operation, the sensing assistant circuit 24 can enhance the voltage difference between the bit line BLAn and the bit line BLAn'.

The differential sensing amplifier 26 can be coupled to the bit lines BLAn and BLAn'. The differential sensing amplifier 26 can generate the data signal $SIG_{DATA}$ by comparing the voltages on the bit lines BLAn and BLAn'.

The pre-charge control circuit 22 includes transistors M5, M6, and M7. The transistor M5 has a first terminal for receiving the third operation voltage VDD, a second terminal coupled to the bit line BLAn, and a control terminal for receiving a control signal $SIG_{ctrl}$. The transistor M6 has a first terminal for receiving the third operation voltage VDD, a second terminal coupled to the bit line BLAn', and a control terminal coupled to the control terminal of the transistor M5. The transistor M7 has a first terminal coupled to the bit line BLAn, a second terminal coupled to the bit line BLAn', and a control terminal coupled to the control terminal of the transistor M5.

During the sensing operation, the control signal $SIG_{ctrl}$ can turn on the transistors M5, M6, and M7. The transistors M5 and M6 can raise the voltages of the bit lines BLAn and BLAn' to the third operation voltage VDD, and the transistor M7 can balance the voltages of the bit lines BLAn and BLAn', thereby improving the reading accuracy. Also, during the read operation, the transistors M5, M6, and M7 can be turned off by the control signal $SIG_{ctrl}$.

The sensing assistant circuit 24 includes transistors M8 and M9. The transistor M8 has a first terminal for receiving the third operation voltage VDD, a second terminal coupled to the bit line BLAn, and a control terminal coupled to the bit line BLAn'. The transistor M9 has a first terminal for receiving the third operation voltage VDD, a second terminal coupled to the bit line BLAn', and a control terminal coupled to the bit line BLAn.

During the read operation, the sensing assistant circuit 24 can enhance the voltage different between the bit line BLAn and the bit line BLAn'. For example, if the voltage of the bit line BLAn' is pulled down by the discharging path formed by the transistors M2 and M4 in the memory cell 100A(m,n), the transistor M8 will be turned on to raise the voltage of the bit line BLAn. Therefore, the voltages of the bit line BLAn and the bit line BLAn' can be differentiated sooner, and the data access time required by the differential sensing amplifier 26 can be reduced.

In FIG. 7, the read control circuit 20 can further include transistors M10 and M11 for controlling the electrical connection between the bit line BLAn and the differential sensing amplifier 26 and the electrical connection between the bit line BLAn' and the differential sensing amplifier 26.

Furthermore, in some embodiments, the memory system 10 can include a plurality of read control circuit 20 for reading multiple data at the same time. For example, the memory system 10 can include N read control circuits 20 to read the data stored in the memory cells coupled to the same word line at the same time. Also, different sectors may share the same read control circuits 20 with a decoder circuit.

In summary, the memory cells and the memory systems provided by the embodiments of the present invention can sense the data currents locally within the memory cell for the read operation so the reference voltage or the reference current required for the read operation in prior art is no longer required. Consequently, the accuracy of the read operation can be improved, and the access time can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory cell comprising:
a first anti-fuse element having a first terminal coupled to an anti-fuse control line, and a second terminal;
a first select transistor having a first terminal, a second terminal coupled to a first bit line, and a control terminal coupled to a word line, and configured to transmit a voltage between the first bit line and the second terminal of the first anti-fuse element according to a voltage on the word line;
a second anti-fuse element having a first terminal coupled to the anti-fuse control line, and a second terminal;
a second select transistor having a first terminal, a second terminal coupled to a second bit line, and a control terminal coupled to the word line, and configured to transmit a voltage between the second bit line and the second terminal of the second anti-fuse element according to the voltage on the word line; and
a sensing control circuit coupled to the first terminal of the first select transistor and the first terminal of the second select transistor, and configured to provide a discharging path to a first system voltage terminal from the first terminal of the first select transistor or from the first terminal of the second select transistor according to states of the first anti-fuse element and the second anti-fuse element during a read operation of the first memory cell.

2. The memory cell of claim 1, wherein during a program operation of the memory cell, the first anti-fuse element and the second anti-fuse element are programmed with complementary data.

3. The memory cell of claim 1, wherein:
the first terminal of the first select transistor is coupled to the second terminal of the first anti-fuse element; and
the first terminal of the second select transistor is coupled to the second terminal of the second anti-fuse element.

4. The memory cell of claim 3, wherein during a program operation of the memory cell:

the anti-fuse control line is at a program voltage;
the word line is at a first operation voltage;
the first bit line is at a first data voltage; and
the second bit line is at a second data voltage;
wherein:
one of the first data voltage and the second data voltage is equal to the first operation voltage, and one of the first data voltage and the second data voltage is equal to a first system voltage; and
the program voltage is greater than the first operation voltage, and the first operation voltage is greater than the first system voltage.

5. The memory cell of claim 1, further comprising:
a first following gate transistor having a first terminal coupled to the second terminal of the first anti-fuse element, a second terminal coupled to the first terminal of the first select transistor, and a control terminal coupled to a following gate control line; and
a second following gate transistor having a first terminal coupled to the second terminal of the second anti-fuse element, a second terminal coupled to the first terminal of the second select transistor, and a control terminal coupled to the following gate control line.

6. The memory cell of claim 5, wherein during a program operation of the memory cell:
the anti-fuse control line is at a program voltage;
the word line is at a first operation voltage;
the following gate control line is at a second operation voltage;
the first bit line is at a first data voltage; and
the second bit line is at a second data voltage;
wherein:
one of the first data voltage and the second data voltage is equal to the first operation voltage, and one of the first data voltage and the second data voltage is equal to a first system voltage; and
the program voltage is greater than the second operation voltage, the second operation voltage is greater than the first operation voltage, and the first operation voltage is greater than the first system voltage.

7. The memory cell of claim 5, wherein the sensing control circuit comprising:
a first transistor having a first terminal coupled to the first terminal of the first select transistor, a second terminal, and a control terminal; and
a second transistor having a first terminal coupled to the first terminal of the second select transistor and the control terminal of the first transistor, a second terminal, and a control terminal coupled to the first terminal of the first transistor;
a third transistor having a first terminal coupled to the second terminal of the first transistor, a second terminal configured to receive a first system voltage, and a control terminal coupled to a sensing control line; and
a fourth transistor having a first terminal coupled to the second terminal of the second transistor, a second terminal configured to receive the first system voltage, and a control terminal coupled to the sensing control line.

8. The memory cell of claim 7, wherein during a sensing operation of the memory cell before the read operation:
the anti-fuse control line is at an anti-fuse bias voltage;
the word line is at the first system voltage;
the following gate control line is at a third operation voltage;
the sensing control line is at the third operation voltage;
the first bit line is at the third operation voltage; and the second bit line is at the third operation voltage;
wherein the anti-fuse bias voltage is greater than the third operation voltage, and the third operation voltage is greater than the first system voltage.

9. The memory cell of claim 8, wherein during the read operation:
the anti-fuse control line is at the anti-fuse bias voltage;
the word line is at the third operation voltage;
the following gate control line is at the third operation voltage;
the sensing control line is at the third operation voltage;
the first bit line is floating; and
the second bit line is floating.

10. A memory system comprising:
a plurality of memory cells, wherein a first memory cell of the plurality of memory cells comprises:
a first anti-fuse element having a first terminal coupled to an anti-fuse control line, and a second terminal;
a first select transistor having a first terminal, a second terminal coupled to a first bit line, and a control terminal coupled to a first word line, and configured to transmit a voltage between the first bit line and the second terminal of the first anti-fuse element according to a voltage on the first word line;
a second anti-fuse element having a first terminal coupled to the anti-fuse control line, and a second terminal;
a second select transistor having a first terminal, a second terminal coupled to a second bit line, and a control terminal coupled to the first word line, and configured to transmit a voltage between the second bit line and the second terminal of the second anti-fuse element according to a voltage on the first word line; and
a first sensing control circuit coupled to the first terminal of the first select transistor and the first terminal of the second select transistor, and configured to provide a discharging path to a first system voltage terminal from the first terminal of the first select transistor or from the first terminal of the second select transistor according to states of the first anti-fuse element and the second anti-fuse element during a read operation of the first memory cell.

11. The memory system of claim 10, wherein during a program operation of the first memory cell, the first anti-fuse element and the second anti-fuse element are programmed with complementary data.

12. The memory system of claim 10, wherein:
the first terminal of the first select transistor is coupled to the second terminal of the first anti-fuse element; and
the first terminal of the second select transistor is coupled to the second terminal of the second anti-fuse element.

13. The memory system of claim 12, wherein during a program operation of the first memory cell:
the anti-fuse control line is at a program voltage;
the first word line is at a first operation voltage;
the first bit line is at a first data voltage; and
the second bit line is at a second data voltage;
wherein:
one of the first data voltage and the second data voltage is equal to the first operation voltage, and one of the first data voltage and the second data voltage is equal to a first system voltage; and
the program voltage is greater than the first operation voltage, and the first operation voltage is greater than the first system voltage.

14. The memory system of claim 13, wherein:
a second memory cell of the plurality of memory cells is coupled to the anti-fuse control line, the first word line, a third bit line, and a fourth bit line; and
during the program operation of the first memory cell:
the third bit line is at the first operation voltage; and
the fourth bit line is at the first operation voltage.

15. The memory system of claim 13, wherein:
a third memory cell of the plurality of memory cells is coupled to the anti-fuse control line, a second word line, the first bit line, and the second bit line; and
during the program operation of the first memory cell:
the second word line is at the first system voltage.

16. The memory system of claim 10, wherein the first memory cell further comprises:
a first following gate transistor having a first terminal coupled to the second terminal of the first anti-fuse element, a second terminal coupled to the first terminal of the first select transistor, and a control terminal coupled to a following gate control line; and
a second following gate transistor having a first terminal coupled to the second terminal of the second anti-fuse element, a second terminal coupled to the first terminal of the second select transistor, and a control terminal coupled to the following gate control line.

17. The memory system of claim 16, wherein during a program operation of the first memory cell:
the anti-fuse control line is at a program voltage;
the first word line is at a first operation voltage;
the following gate control line is at a second operation voltage;
the first bit line is at a first data voltage; and
the second bit line is at a second data voltage;
wherein:
one of the first data voltage and the second data voltage is equal to the first operation voltage, and one of the first data voltage and the second data voltage is equal to a first system voltage; and
the program voltage is greater than the second operation voltage, the second operation voltage is greater than the first operation voltage, and the first operation voltage is greater than the first system voltage.

18. The memory system of claim 17, wherein:
a second memory cell of the plurality of memory cells comprises:
a third anti-fuse element having a first terminal coupled to the anti-fuse control line, and a second terminal;
a third select transistor having a first terminal, a second terminal coupled to a third bit line, and a control terminal coupled to the first word line;
a third following gate transistor having a first terminal coupled to the second terminal of the third anti-fuse element, a second terminal coupled to the first terminal of the third select transistor, and a control terminal coupled to the following gate control line;
a fourth anti-fuse element having a first terminal coupled to the anti-fuse control line, and a second terminal;
a fourth select transistor having a first terminal, a second terminal coupled to a fourth bit line, and a control terminal coupled to the first word line;
a fourth following gate transistor having a first terminal coupled to the second terminal of the fourth anti-fuse element, a second terminal coupled to the first terminal of the fourth select transistor, and a control terminal coupled to the following gate control line; and a second sensing control circuit coupled to the first terminal of the third select transistor and the first terminal of the fourth select transistor; and during the program operation of the first memory cell:
the third bit line is at the first operation voltage; and
the fourth bit line is at the first operation voltage.

19. The memory system of claim 17, wherein:
a third memory cell of the plurality of memory cells comprises:
a fifth anti-fuse element having a first terminal coupled to the anti-fuse control line, and a second terminal;
a fifth select transistor having a first terminal, a second terminal coupled to the first bit line, and a control terminal coupled to a second word line;
a fifth following gate transistor having a first terminal coupled to the second terminal of the fifth anti-fuse element, a second terminal coupled to the first terminal of the fifth select transistor, and a control terminal coupled to the following gate control line;
a sixth anti-fuse element having a first terminal coupled to the anti-fuse control line, and a second terminal;
a sixth select transistor having a first terminal, a second terminal coupled to the second bit line, and a control terminal coupled to the second word line;
a sixth following gate transistor having a first terminal coupled to the second terminal of the sixth anti-fuse element, a second terminal coupled to the first terminal of the sixth select transistor, and a control terminal coupled to the following gate control line; and
a third sensing control circuit coupled to the first terminal of the fifth select transistor and the first terminal of the sixth select transistor; and
during the program operation of the first memory cell:
the second word line is at the first system voltage.

20. The memory system of claim 16, wherein the first sensing control circuit comprising:
a first transistor having a first terminal coupled to the first terminal of the first select transistor, a second terminal, and a control terminal; and
a second transistor having a first terminal coupled to the first terminal of the second select transistor and the control terminal of the first transistor, a second terminal, and a control terminal coupled to the first terminal of the first transistor;
a third transistor having a first terminal coupled to the second terminal of the first transistor, a second terminal configured to receive a first system voltage, and a control terminal coupled to a sensing control line; and
a fourth transistor having a first terminal coupled to the second terminal of the second transistor, a second terminal configured to receive the first system voltage, and a control terminal coupled to the sensing control line.

21. The memory system of claim 20, wherein during a sensing operation of the first memory cell before the read operation:

the anti-fuse control line is at an anti-fuse bias voltage;
the first word line is at the first system voltage;
the following gate control line is at a third operation voltage;
the sensing control line is at the third operation voltage;
the first bit line is at the third operation voltage; and
the second bit line is at the third operation voltage;
wherein the anti-fuse bias voltage is greater than the third operation voltage, and the third operation voltage is greater than the first system voltage.

22. The memory system of claim 21, wherein during the read operation:
the anti-fuse control line is at the anti-fuse bias voltage;
the first word line is at the third operation voltage;
the following gate control line is at the third operation voltage;
the sensing control line is at the third operation voltage;
the first bit line is floating; and
the second bit line is floating.

23. The memory system of claim 22, further comprising a read control circuit comprising:
a pre-charge control circuit coupled to the first bit line and the second bit line, and configured to pre-charge the first bit line and the second bit line to the third operation voltage during the sensing operation;
a sensing assistant circuit coupled to the first bit line and the second bit line, and configured to differentiate voltages on the first bit line and the second bit line during the read operation;
a differential sensing amplifier coupled to the first bit line and the second bit line, and configured to generate a data signal by comparing the voltages on the first bit line and the second bit line.

24. The memory system of claim 23, wherein the pre-charge control circuit comprising:
a fifth transistor having a first terminal configured to receive the third operation voltage, a second terminal coupled to the first bit line, and a control terminal configured to receive a control signal;
a sixth transistor having a first terminal configured to receive the third operation voltage, a second terminal coupled to the second bit line, and a control terminal coupled to the control terminal of the fifth transistor; and
a seventh transistor having a first terminal coupled to the first bit line, a second terminal coupled to the second bit line, and a control terminal coupled to the control terminal of the fifth transistor.

25. The memory system of claim 23, wherein the sensing assistant circuit comprising:
an eighth transistor having a first terminal configured to receive the third operation voltage, a second terminal coupled to the first bit line, and a control terminal coupled to the second bit line; and
a ninth transistor having a first terminal configured to receive the third operation voltage, a second terminal coupled to the second bit line, and a control terminal coupled to the first bit line.

* * * * *